United States Patent
Liang et al.

(10) Patent No.: US 11,244,850 B2
(45) Date of Patent: Feb. 8, 2022

(54) ON INTEGRATED CIRCUIT (IC) DEVICE SIMULTANEOUSLY FORMED CAPACITOR AND RESISTOR

(71) Applicant: International Business Machines Corporation, Armonk, NY (US)

(72) Inventors: Jim Shih-Chun Liang, Poughkeepsie, NY (US); Baozhen Li, South Burlington, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 16/686,942

(22) Filed: Nov. 18, 2019

(65) Prior Publication Data
US 2021/0151345 A1    May 20, 2021

(51) Int. Cl.
*H01L 21/70* (2006.01)
*H01L 49/02* (2006.01)
*H01L 27/01* (2006.01)

(52) U.S. Cl.
CPC .......... *H01L 21/707* (2013.01); *H01L 27/016* (2013.01); *H01L 28/20* (2013.01); *H01L 28/60* (2013.01)

(58) Field of Classification Search
CPC .............................. H01L 28/20; H01L 27/016
See application file for complete search history.

(56) References Cited

U.S. PATENT DOCUMENTS

| | | | |
|---|---|---|---|
| 6,709,918 B1 | 3/2004 | Ng et al. | |
| 6,730,573 B1 | 5/2004 | Ng et al. | |
| 6,890,810 B2 | 5/2005 | Amadon et al. | |
| 7,022,246 B2 | 4/2006 | Chinthakindi et al. | |
| 7,154,158 B2 | 12/2006 | Kikuta et al. | |
| 8,111,129 B2 | 2/2012 | Hakey et al. | |
| 9,029,983 B2 | 5/2015 | Chen et al. | |
| 9,627,312 B2 | 4/2017 | Childs et al. | |
| 2007/0080426 A1 | 4/2007 | Matz et al. | |
| 2009/0309186 A1* | 12/2009 | Inoue | H01L 23/5223 257/532 |
| 2013/0341759 A1 | 12/2013 | Huang et al. | |

OTHER PUBLICATIONS

P. Zurcher, et al., "Integration of thin film MIM capacitors and resistors into copper metallization based RF-CMOS and Bi-CMOS technologies," International Electron Devices Meeting 2000. Technical Digest. IEDM (Cat. No.00CH37138).

\* cited by examiner

*Primary Examiner* — Fernando L Toledo
*Assistant Examiner* — Valerie N Newton
(74) *Attorney, Agent, or Firm* — ZIP Group PLLC (57) ABSTRACT

An IC device includes a simultaneously formed capacitor and resistor structure. The capacitor and resistor may be located between a Back End of the Line (BEOL) interconnect stack and an external device interconnect pad of the IC device. The resistor may be used to step down a voltage applied across the resistor. The resistor may include one or more resistor plates that are formed simultaneously with a respective one or more plates of the capacitor. For example, a capacitor plate and a resistor plate may be patterned and formed from the same conductive sheet. Each of the resistor plates may be connected to one or more vertical interconnect accesses (VIA).

6 Claims, 9 Drawing Sheets

ON INTEGRATED CIRCUIT (IC) DEVICE SIMULTANEOUSLY FORMED CAPACITOR AND RESISTOR

FIELD

Embodiments of invention generally relate to integrated circuit (IC) devices and IC device fabrication methods. More particularly, embodiments relate to IC devices with a capacitor and a resistor that are simultaneously formed.

SUMMARY

In an embodiment of the present invention, a method is presented. The method includes simultaneously forming a first capacitor plate and a first resistor plate upon a first dielectric layer of an integrated circuit (IC) device. The method further includes forming a first resistor vertical interconnect access (VIA) upon a first back end of the line (BEOL) upper metallization trace. The first resistor VIA is connected to the first resistor plate. The method further includes forming a second resistor VIA upon a second BEOL upper metallization trace. The second resistor VIA is connected to the first resistor plate. The method further includes applying a voltage to the first resistor VIA and to a first functional circuit connected to the first resistor VIA below the first BEOL upper metallization trace. The method further includes dropping the voltage across the first resistor plate. The method further includes applying the dropped voltage to the second resistor VIA and to a second functional circuit connected to the second resistor VIA below the second BEOL upper metallization trace.

In another embodiment of the present invention, a method is presented. The method includes simultaneously forming a first capacitor plate and a first resistor plate upon a first dielectric layer of an integrated circuit (IC) device. The method further includes forming a first resistor vertical interconnect access (VIA) upon a first back end of the line (BEOL) upper metallization trace. The first resistor VIA is connected to the first resistor plate. The method further includes forming a second resistor VIA upon a second BEOL upper metallization trace. The second resistor VIA is connected to the first resistor plate. The first resistor VIA is configured to receive an applied voltage. The first resistor plate is configured to drop the applied voltage. The second resistor VIA is configured to receive the dropped applied voltage.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to IC devices, such as wafers, processors, application specific integrated circuits (ASICs), field programmable gate arrays (FPGAs), or the like that include a simultaneously formed capacitor and resistor structure. The capacitor and resistor may be located between a Back End of the Line (BEOL) interconnect stack and an external device interconnect pad of the IC device. The resistor may be used to step down a voltage applied across the resistor. The resistor may include one or more resistor plates that are formed simultaneously with a respective one or more plates of the capacitor. For example, a capacitor plate and a resistor plate may be patterned and formed from the same conductive sheet. Each of the resistor plates may be connected to one or more vertical interconnect accesses (VIA).

Figure 1:
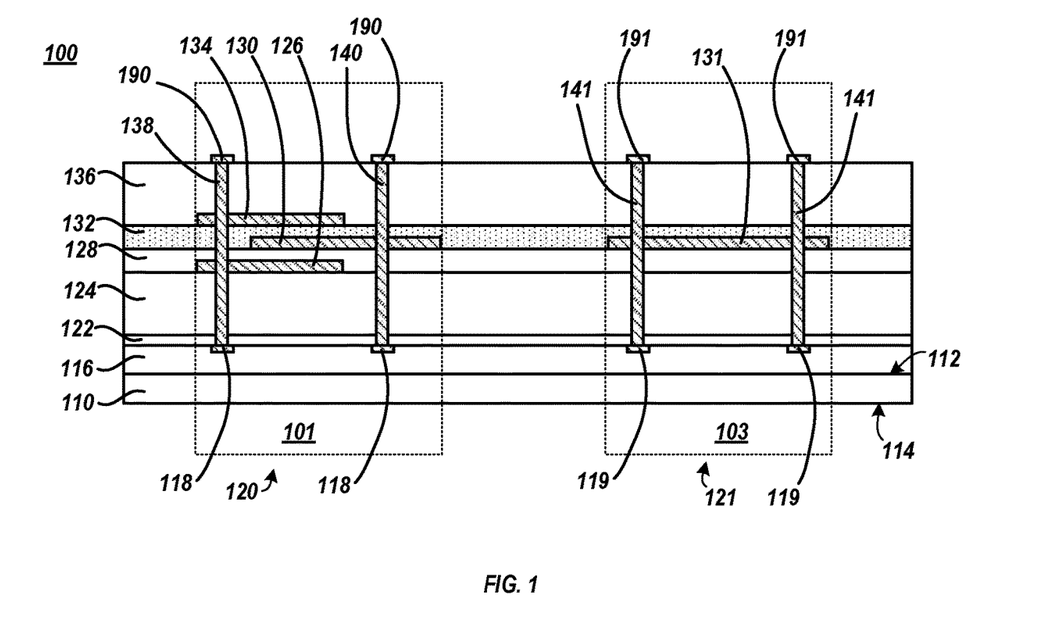
FIG. 1 is a cross-section elevation view of an on IC device capacitor and resistor structure, according to an exemplary embodiment.

FIG. 1 is a cross-section elevation view of an on IC device 100 capacitor and resistor structure, according to an exemplary embodiment. IC device 100 includes a capacitor region 101 and a resistor region 103. The resistor region 103 may be directly adjacent, or neighboring, the capacitor region 101 or resistor region 103 may be separated from the capacitor region 101 by another circuit element. The resistor region 103 may separate a pair of capacitor regions 101. In the present embodiment, IC device 100 capacitor and resistor structure includes a resistor plate 131 simultaneously formed along with capacitor plate 130. The resistor region 103 may be defined by the width of resistor plate(s), as depicted whereby the side surfaces of the resistor plate(s) are coplanar with the side boundaries of resistor region 103. The resistor region 103 may be further defined by the depth of the resistor plate(s), as depicted whereby the front and rear surfaces of the resistor plate(s) are coplanar with the front and rear boundaries of resistor region 103.

A semiconductor substrate 110 includes an active surface 112 and a backside surface 114 as well as a back-end (BE) metallization layer 116. In embodiments, the semiconductor substrate 110 is a semiconductor material such as but not limited to silicon (Si), silicon germanium (SiGe), germanium (Ge), or III-V compound semiconductors. The semiconductor substrate 110 can be monocrystalline, epitaxial crystalline, or polycrystalline. In embodiments, the semiconductor substrate 110 is a semiconductor heterostructure such as but not limited to a silicon-on-insulator (SOI) substrate, or a multi-layered substrate comprising silicon, silicon germanium, germanium, III-V compound semiconductors, and any combinations thereof. Active devices are located at the active surface 112 and they refer to components such as but not limited to gates, transistors, rectifiers, and isolation structures that form parts of integrated circuits. The active devices are coupled as functional circuits by the BE metallization layer 116.

The BE metallization layer 116 may also be referred to as a BE interconnect stack. The BE metallization layer 116 may include metal circuit traces, such as from metal-1 (M1) up to metal-n (Mn) such as M11, but not limited to M11. In embodiments, an upper metallization trace 118, 119 is the Mn metallization. The BE metallization layer 116 is illustrated in simplified form, but it comprises multiple levels of interconnects that are isolated from one another by multiple layers of interlayer dielectric (ILD) materials, as is known in the art.

An on IC device capacitor structure 120 is disposed above and on the BE metallization layer 116 within capacitor region 101 and an on IC device resistor structure 121 is disposed above and on the BE metallization layer 116 within resistor region 103. In embodiments, a via etch-stop first layer 122 is formed upon the upper metallization trace 118, 119 as it is exposed through the BE metallization layer 116. Thereafter, a first vertical interconnect access (VIA) interlayer dielectric (ILD) layer 124 is disposed above the upper metallization trace 118, 119. In this embodiment, the first VIA ILD layer 124 is disposed above and on the via etch-stop first layer 122. In embodiments, the via etch-stop first layer 122 is made of a material such as silicon carbide. Other materials may be chosen for the via etch-stop first layer 122 depending upon a given useful application of disclosed embodiments.

A patterned capacitor plate 126 is formed upon the first VIA ILD 124 within capacitor regions 101. In some embodiments, a resistor plate 127 may be simultaneously formed along with the capacitor plate 126 upon the first VIA ILD 124 within resistor regions 103. A capacitor first dielectric layer 128 is formed upon the VIA ILD 124, over the patterned capacitor plate 126 and over the patterned resistor plate 127, if present. The capacitor plate 126 and the resistor plate 127 may include one or more VIA pilot holes therein in desired VIA location(s) to assist in the fabrication or etching of VIA trenches.

A patterned capacitor plate 130 is formed upon the capacitor first dielectric layer 128 and has an effective portion that is substantially parallel-planar with the patterned capacitor plate 126 in capacitor region 101. In some embodiments, a resistor plate 131 may be simultaneously formed along with the capacitor plate 130 upon the first dielectric layer 128 within resistor regions 103. Patterned resistor plate 131 has an effective portion that is substantially parallel-planar with the patterned resistor plate 127. The capacitor plate 130 and the resistor plate 131 may include one or more VIA pilot holes therein in desired VIA location(s) to assist in the fabrication or etching of VIA trenches. VIA pilot holes within capacitor plate 126 and capacitor plate 130 may be vertically aligned. Likewise, VIA pilot holes within resistor plate 127 and resistor plate 131 may be vertically aligned.

A capacitor second dielectric layer 132 is formed upon the first dielectric layer 128, over the patterned capacitor plate 130, over the patterned resistor plate 131, if present. A patterned capacitor plate 134 is formed upon the capacitor second dielectric layer 132 in capacitor region 101 and has an effective portion that is substantially parallel-planar with the patterned capacitor plate 130. In some embodiments, a resistor plate 135 may be simultaneously formed along with the capacitor plate 134 upon the second dielectric layer 132 within resistor regions 103. Patterned resistor plate 135 has an effective portion that is substantially parallel-planar with the patterned resistor plate 131. The capacitor plate 134 and the resistor plate 135 may include one or more VIA pilot holes therein in desired VIA location(s) to assist in the fabrication or etching of VIA trenches. VIA pilot holes within capacitor plate 134 and capacitor plate 130 may be vertically aligned. Likewise, VIA pilot holes within resistor plate 135 and resistor plate 131 may be vertically aligned.

A second VIA ILD layer 136 is formed upon the capacitor second dielectric layer 132, over the patterned capacitor plate 134, and over the patterned resistor plate 135, if present.

Electrically conductive materials may be selected to obtain useful capacitor and/or resistor embodiments. In embodiments, the plates 126, 127, 130, 131, 134, and 135 are made from a metal. In embodiments, the plates are a copper, tungsten, titanium, tantalum, cobalt, composition. In embodiments, the plates are a titanium nitride (TixNy) composition, a titanium silicide (TixSiy) composition, a tungsten silicide (WxSiy) composition, a tantalum nitride (TaxNy) composition, a cobalt nitride (TaxNy) composition, or the like, where x and y may be chosen to make up either stoichiometric or non-stoichiometric ratios. In embodiments, the plates 126, 127, 130, 131, 134, and 135 are made from a semiconductor such as those like poly Silicon, doped poly Silicon.

In embodiments, plate 126, 130, 134, 135 thickness is in a range from 20 to 50 nanometer (nm). Dielectric materials may be selected to obtain useful capacitor embodiments. In embodiments, a high-k dielectric (k>6) is used. In embodiments, a capacitor dielectric material is an oxide. In embodiments, a capacitor dielectric material is silicon dioxide (SiO2). In embodiments, a capacitor dielectric material is a hafnium oxide (HfxOy) where x and y may be chosen to make up either stoichiometric or non-stoichiometric ratios.

In embodiments, a capacitor dielectric material is an aluminum oxide (AlxOy) where x and y may be chosen to make up either stoichiometric or non-stoichiometric ratios.

In embodiments, a capacitor dielectric material is a lead zirconate titanate (PZT) material. In embodiments, a capacitor dielectric material is a barium strontium titanate (BST) material.

In embodiments, a mixture of oxides is used such as one oxide for the capacitor dielectric first layer 128 and a different oxide for the capacitor dielectric second layer 132. In embodiments, a given capacitor dielectric layer is a mixture of two or more oxides. In an example embodiment, the capacitor dielectric first layer 128 is a hafnium oxide and the capacitor dielectric second layer 132 is an aluminum oxide. It may now be understood by these examples that a capacitor dielectric first layer 128 may be of a first composition such as hafnium oxide and the capacitor dielectric second layer 132 may be of a second composition such as aluminum oxide. One layer may be of "the same" as the other layer such as identical chemistries. One layer may be "different" from the other layer such as the same qualitative chemistries but of different stoichiometries. One layer may be "different" from the other layer such as the different qualitative chemistries such as a halfnium oxide in one and an aluminum oxide in the other. One layer may be "different" from the other layer such as the different qualitative chemistries such as a halfnium oxide in one and a mixture of an aluminum oxide and halfnium oxide in the other. One layer may be "different" from the other layer such as the different qualitative chemistries such as an aluminum oxide in one and a mixture of an aluminum oxide and halfnium oxide in the other. By these embodiments it should be understood that other dielectric materials may be mixed and matched where different capacitances are useful between the several plates.

Electrical coupling of the capacitor structure 120 between the semiconductor substrate 110 and the outside world (i.e. BE metallization 190 and above, as depicted) is accomplished by a power via 138 and a ground via 140. As illustrated in this embodiment, the power via 138 is in contact with both the patterned capacitor plate 126 and the patterned capacitor plate 134. Grounding is accomplished in this embodiment by direct contact between the ground via 140 and the patterned capacitor plate 130.

Electrical coupling of the resistor structure 121 between the semiconductor substrate 110 and the outside world (i.e. BE metallization 191 and above, as depicted) is accomplished by a resistor via 141. As illustrated in this embodiment, one or more resistor VIAs 141 are in contact with resistor plate 135. In other embodiments, the one or more resistor VIAs may be further connected to each of the present resistor plates e.g., connected to plates 127, 131, and 135. VIAs 138, 140, and 141 may be fabricated in the same or a shared fabrication stage.

In embodiments, the VIAs 138, 140, 141 may have a VIA liner adhesion layer that assists in making a useful bond between the VIAs and adjacent structures. Formation of the VIA liner adhesion layer may be done by a chemical vapor deposition of a liner material such as titanium or tungsten. In embodiments, the adhesion layer is titanium. In embodiments, the adhesion layer is titanium tungsten (TiW). In embodiments, the adhesion layer is tantalum. In embodiments, the adhesion layer may be a bilayer. For example, the adhesion layer may be a bilayer of Tantalum Nitride and Tantalum deposited by chemical or physical vapor deposition. Thickness of the adhesion layer may be useful in a range from 50 to 500 Angstrom (A) according to embodiments.

In embodiments, the VIAs 138, 140, 141 are filled copper pillars. Electrical coupling of the VIA 138, 140, 141 to external electrical features may be accomplished in embodiments by electrical bumps that are disposed on pads that contact the VIAs, as is known in the art. The electrical bumps may be solder and part of a controlled-collapse chip connection (C4) that can be attached to conductive traces of an IC device carrier, or the like. In embodiments, the electrical bumps have a diameter in a range from 50 to 100 µm.

It may now be understood that the on IC device capacitor structure 120 and on resistor structure 121 may be coupled above the second VIA ILD 136 to further materials instead of to a bump. For example, additional BE metallization may be fabricated above the second VIA ILD 136. In embodiments, the upper portion of the VIAs 138, 140, 141 are contacted by metallization traces or contacts instead of the pads.

It may now be appreciated that the power via 138 may be referred to as a first via 138 coupled to the capacitor plate 126 and the capacitor plate 134. Similarly, but according to this embodiment, the ground via 140 may be referred to as a second via 140 coupled to the capacitor plate 130. It may now be appreciated that the resistor via 141 may be referred to as a third via 141 coupled to the present resistor plate(s).

It may now also be appreciated that the respective first and second VIAs 138 and 140 each penetrate and contact one or more capacitor plates, as appropriate, while connecting between the semiconductor substrate 110 and the outside world. In FIG. 1, the first via 138 penetrates and contacts at a first plate 126 contact point and penetrates and contacts at a third plate 134 contact point. Also, the second via 140 penetrates and contacts at a second-plate 130 contact point. Further, the third via 141 penetrates and contacts at respective contact point(s) of each of the present resistor plates 127, 131, 135, etc.

In embodiments, the on IC device capacitor 120 is used as a decoupling capacitor. The decoupling capacitor can be formed between power (+V) and ground (gnd) to decouple a circuit found in the semiconductor substrate 110 without changing or affecting an existing circuit layout in the silicon. In embodiments, the on IC device capacitor 100 is used as a noise filter. In embodiments, the on IC device capacitor 120 is used as a sensor. In embodiments, the IC device capacitor 120 is a metal-insulator-metal-insulator-metal (MIMIM, MIMIM1, etc.) structure.

In embodiments, the on IC device resistor 121 is used to step down or otherwise reduce an applied voltage. The resistor 121 can be formed between power (+V) and ground (gnd) to step down a voltage applied to a first resistor VIA 191. For example, a voltage applied to the resistor VIA 191 depicted on the left of resistor 121 is reduced across the resistor plate(s) such that the voltage of resistor VIA 191 depicted on the right of resistor 121 is at a lower relative voltage or potential. The number and/or relative surface area (i.e. plane depicted in e.g., FIG. 2) of plates 127, 131, 135, etc. may be chosen depending upon a desired reduction of the applied voltage.

In embodiments, respective top and bottom surfaces of a resistor plate and of the simultaneously formed capacitor plate may be coplanar. For example, as depicted, respective top and bottom surfaces of capacitor plate 130 and resistor plate 131 may be coplanar.

Figure 2:
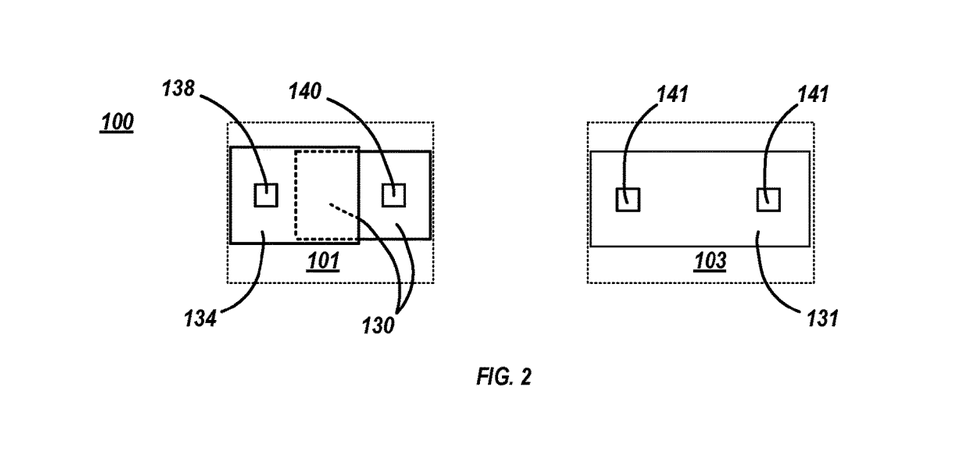
FIG. 2 is a top plan cut-away view of the capacitor and resistor structure depicted in FIG. 1, according to an exemplary embodiment.

FIG. 2 is a top plan cut-away view of the capacitor and resistor structure depicted in FIG. 1, according to an exemplary embodiment. For illustration purposes, several structures are not shown in order to better describe selected structures.

In capacitor region 101, the second plate 130 is shown partially obscured (as phantom lines) by the third plate 134. As depicted, the third plate 134 is contacted by the power via 138, and the second plate 130 is contacted by the ground via 140. The first plate 126 is not depicted in FIG. 2, but it would be disposed below the second plate 130 as seen in FIG. 1.

In resistor region 103, the resistor plate 131 is contacted by the resistor VIAs 141. Respective front and rear side surfaces of the resistor plate(s) may be coplanar with one or more respective front and rear side surfaces of the capacitor plate(s), as depicted. Relative size of resistor plate 131 may be chosen in order to achieve the desired voltage drop across the resistor plate 131.

Figure 3:
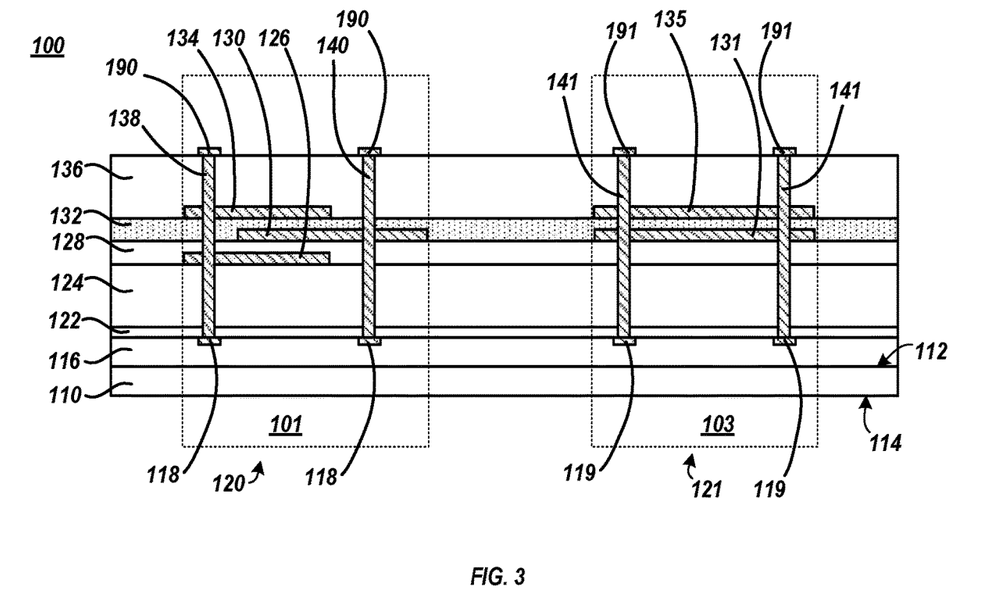
FIG. 3 is a cross-section elevation view of an on IC device capacitor and resistor structure, according to an exemplary embodiment.

FIG. 3 is a cross-section cut-away view of an on IC device 100 capacitor and resistor structure, according to an exemplary embodiment. In the depicted embodiment, IC device 100 includes two resistor plates 131, 135. Resistor plate 131 is formed simultaneously with capacitor plate 130 and resistor plate 135 is simultaneously formed with capacitor plate 134. The respective sidewalls of resistor plates 131, 135 may be coplanar, as depicted. In other embodiments, respective sidewalls of resistor plates 131, 135 may be may not be coplanar. For example, the sidewalls of resistor plate 135 may be inset from respective sidewalls of resistor plate 131, or the like.

Figure 4:
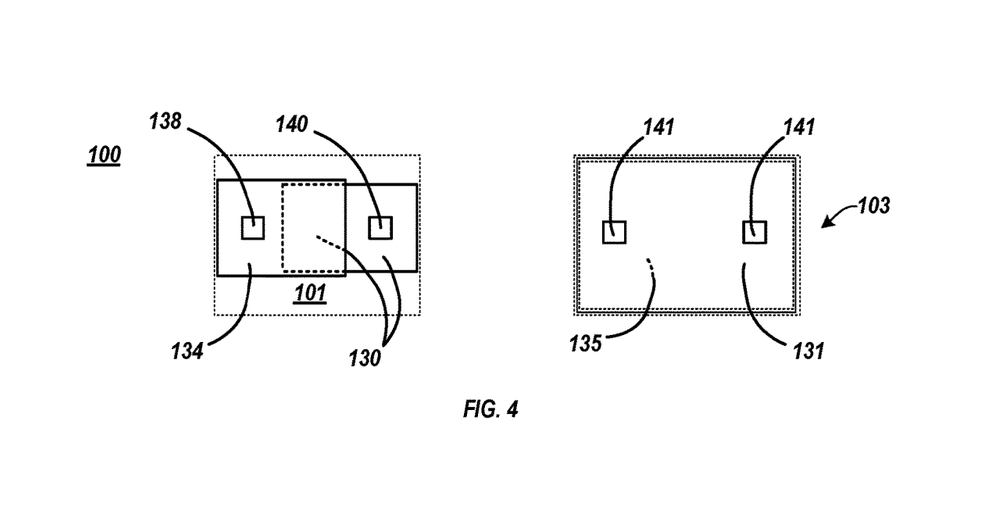
FIG. 4 is a top plan cut-away view of the capacitor and resistor structure depicted in FIG. 3, according to an exemplary embodiment.

FIG. 4 is a top plan cut-away view of the capacitor and resistor structure depicted in FIG. 3, according to an exemplary embodiment. For illustration purposes, several structures are not shown in order to better describe selected structures.

In capacitor region 101, the second plate 130 is shown partially obscured (as phantom lines) by the third plate 134. As depicted, the third plate 134 is contacted by the power via 138, and the second plate 130 is contacted by the ground via 140. The first plate 126 is not depicted in FIG. 4, but it would be disposed below the second plate 130 as seen in FIG. 3.

In resistor region 103, the resistor plate 131 is shown obscured (as phantom lines) by resistor plate 135. The respective front and rear sidewalls of resistor plates 131, 135 may be coplanar, as depicted. In other embodiments, respective front and rear sidewalls of resistor plates 131, 135 may be may not be coplanar. For example, the front and rear sidewalls of resistor plate 135 may be inset from respective sidewalls of resistor plate 131, or the like. Relative sizes of resistor plates 131, 135 may be chosen in order to achieve the desired voltage drop across the resistor plates 131, 135. The resistor plates 131, 135 are contacted by the resistor VIAs 141. Respective front and rear side surfaces of the capacitor plate(s) may be inset relative to respective front and rear side surfaces of the resistor plates, 131, 135, as depicted.

Figure 5:
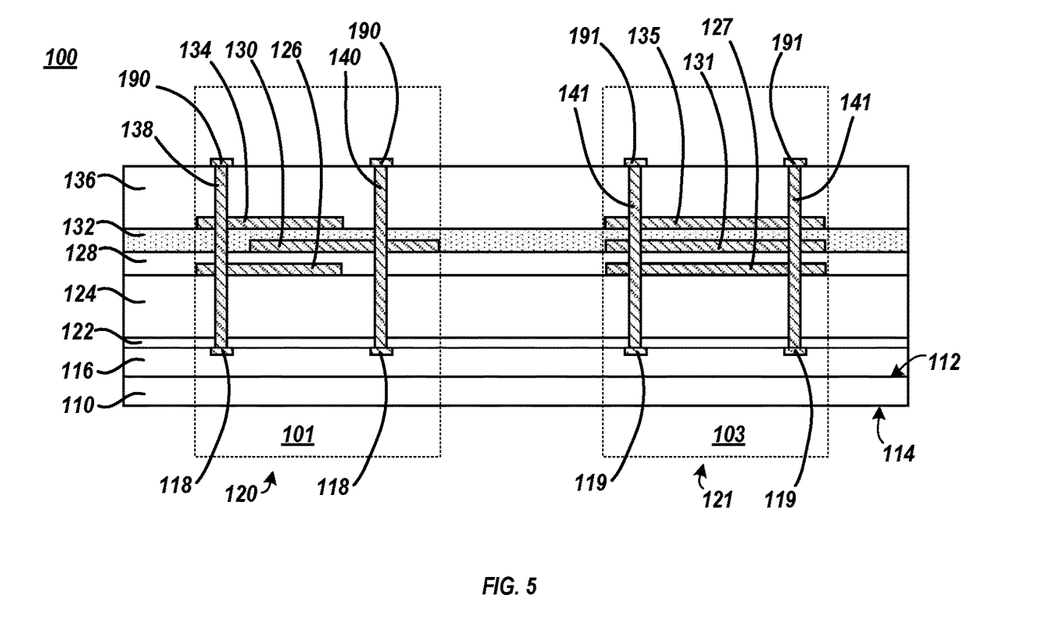
FIG. 5 is a cross-section elevation view of an on IC device capacitor and resistor structure, according to an exemplary embodiment.

FIG. 5 is a cross-section cut-away view of an on IC device 100 capacitor and resistor structure, according to an exemplary embodiment. In the depicted embodiment, IC device 100 includes three resistor plates 127, 131, 135. Resistor plate 127 is formed simultaneously with capacitor plate 126, resistor plate 131 is formed simultaneously with capacitor plate 130, and resistor plate 135 is simultaneously formed with capacitor plate 134. The respective sidewalls of resistor plates 127, 131, 135 may be coplanar, as depicted. In other embodiments, respective sidewalls of resistor plates 127, 131, 135 may be may not be coplanar.

Figure 6:
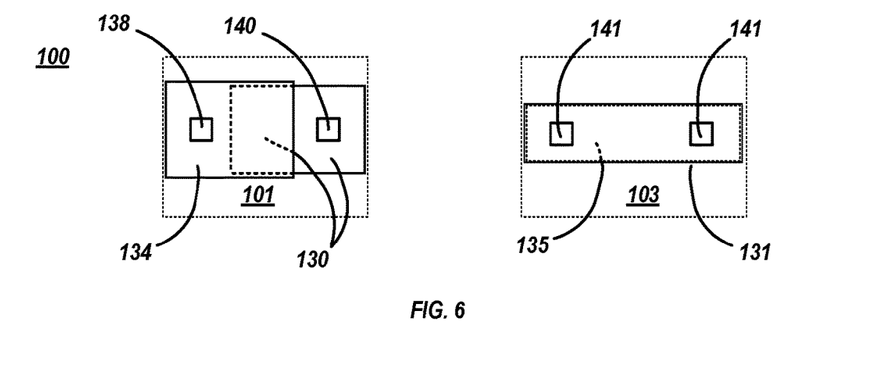
FIG. 6 is a top plan cut-away view of the capacitor and resistor structure depicted in FIG. 5, according to an exemplary embodiment.

FIG. 6 is a top plan cut-away view of the capacitor and resistor structure depicted in FIG. 3, according to an exemplary embodiment. For illustration purposes, several structures are not shown in order to better describe selected structures.

In capacitor region 101, the second plate 130 is shown partially obscured (as phantom lines) by the third plate 134. As depicted, the third plate 134 is contacted by the power via 138, and the second plate 130 is contacted by the ground via 140. The first plate 126 is not depicted in FIG. 6, but it would be disposed below the second plate 130 as seen in FIG. 5.

In resistor region 103, the resistor plate 131 is shown obscured (as phantom lines) by resistor plate 135. Resistor plate 127 is not depicted in FIG. 6, but it would be disposed below resistor plate 131 as seen in FIG. 5. The respective front and rear sidewalls of resistor plates 127, 131, 135 may be coplanar, as depicted. In other embodiments, respective front and rear sidewalls of resistor plates 131, 135 may be may not be coplanar. For example, the front and rear sidewalls of resistor plates 127, 131 may be inset from respective sidewalls of resistor plate 135 or vice versa, or the like. Relative sizes of resistor plates 127, 131, 135 may be chosen in order to achieve the desired voltage drop across the resistor plates 127, 131, 135. The resistor plates 127, 131, 135 are contacted by the resistor VIAs 141. Respective front and rear side surfaces of resistor plates 127, 131, 135 may be inset relative to respective front and rear side surfaces of the capacitor plates as depicted.

Figure 7:
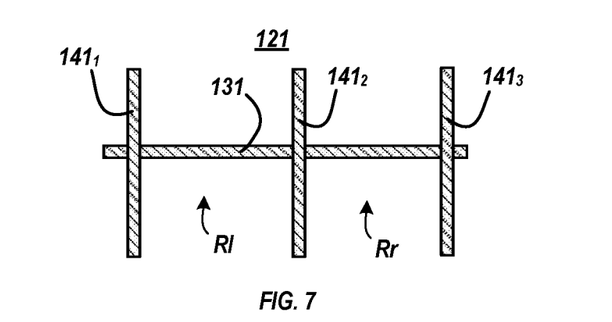
FIG. 7 through FIG. 12 are detailed cross-section elevation views of resistor structures, according to an exemplary embodiments.

FIG. 7 depicts a detailed cross-section elevation view of resistor structure 103, according to an exemplary embodiment. In the depicted embodiment, resistor 121 includes resistor VIAs $141_1$, $141_2$, and $141_3$ that are connected to resistor plate 131. Resistor plate 131 has a constituent resistance 131 Rl between resistor VIAs $141_1$ and $141_2$ and a constituent resistance 131 Rr between resistor VIAs $141_2$ and $141_3$.

A reference voltage Vref is applied to VIA $141_1$. The voltage of VIA $141_2$ drops proportionally to 131 Rl. Similarly, the voltage of VIA $141_3$ drops proportionally to 131 Rl plus 131 Rr.

Alternatively, a reference voltage Vref is applied to VIA $141_2$. The voltage of VIA $141_1$ drops proportionally to 131 Rl and the voltage of VIA $141_3$ drops proportionally to 131 Rr.

Figure 8:
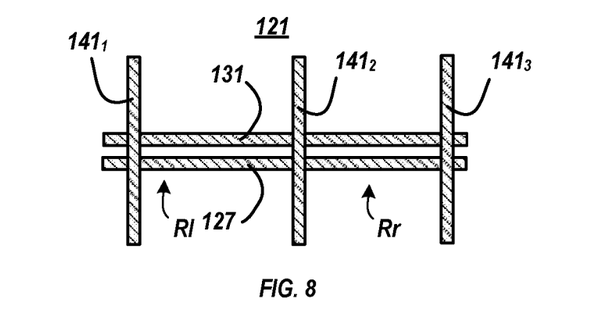

FIG. 8 depicts a detailed cross-section elevation view of resistor structure 103, according to an exemplary embodiment. In the depicted embodiment, resistor 121 includes resistor VIAs $141_1$, $141_2$, and $141_3$ that are each connected to resistor plate 131 and to resistor plate 127. Resistor plate 131 has a constituent resistance 131 Rl between resistor VIAs $141_1$ and $141_2$ and a constituent resistance 131 Rr between resistor VIAs $141_2$ and $141_3$. Similarly, resistor plate 127 has a constituent resistance 127 Rl between resistor VIAs $141_1$ and $141_2$ and a constituent resistance 127 Rr between resistor VIAs $141_2$ and $141_3$.

A reference voltage Vref is applied to VIA $141_1$. The voltage of VIA $141_2$ drops proportionally to the reciprocal of [1/131 Rl plus 1/127 Rl]. Similarly, the voltage of VIA $141_3$ drops proportionally to the reciprocal of [(1/131 Rl) plus (1/127 R)l] plus the reciprocal of [(1/131 Rr) plus (1/127 Rr)].

Alternatively, a reference voltage Vref is applied to VIA $141_2$. The voltage of VIA $141_1$ drops proportionally to the reciprocal of [1/131 Rl plus 1/127 Rl]. The voltage of VIA $141_3$ drops proportionally to the reciprocal of [1/131 Rr plus 1/127 Rr].

Figure 9:
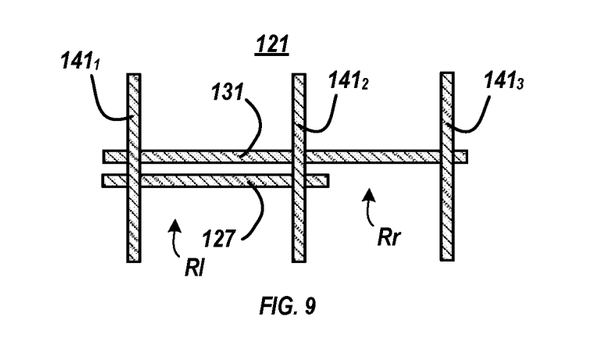

FIG. 9 depicts a detailed cross-section elevation view of resistor structure 103, according to an exemplary embodiment. In the depicted embodiment, resistor 121 includes resistor VIAs $141_1$, $141_2$, and $141_3$. Resistor VIAs $141_1$, $141_2$ are each connected to resistor plate 131 and to resistor plate 127. Resistor VIA $141_3$ is connected to just resistor plate 131.

Resistor plate 131 has a constituent resistance 131 Rl between resistor VIAs $141_1$ and $141_2$ and a constituent resistance 131 Rr between resistor VIAs $141_2$ and $141_3$. Similarly, resistor plate 127 has a constituent resistance 127 Rl between resistor VIAs $141_1$ and $141_2$ and constituent resistance 127 Rr between resistor VIAs $141_2$ and $141_3$.

A reference voltage Vref is applied to VIA $141_1$. The voltage of VIA $141_2$ drops proportionally to the reciprocal of [(1/131 Rl) plus (1/127 Rl)]. Similarly, the voltage of VIA $141_3$ drops proportionally to the reciprocal of [(1/131 Rl) plus (1/127 Rl)] plus 131 Rr.

Alternatively, a reference voltage Vref is applied to VIA $141_2$. The voltage of VIA $141_1$ drops proportionally to the reciprocal of [1/131 Rl plus 1/127 Rl]. The voltage of VIA $141_3$ drops proportionally to 131 Rr.

Figure 10:
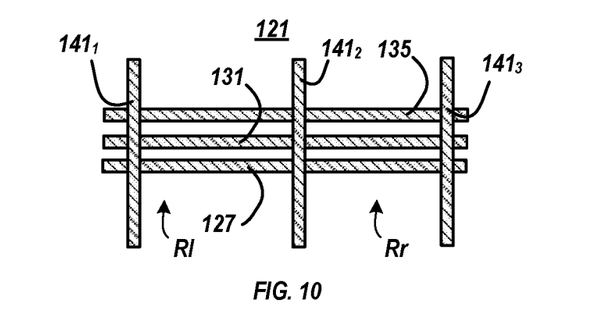

FIG. 10 depicts a detailed cross-section elevation view of resistor structure 103, according to an exemplary embodiment. In the depicted embodiment, resistor 121 includes resistor VIAs $141_1$, $141_2$, and $141_3$ that are each connected to resistor plate 131, to resistor plate 127, and to resistor plate 135. Resistor plate 131 has a constituent resistance 131 Rl between resistor VIAs $141_1$ and $141_2$ and a constituent resistance 131 Rr between resistor VIAs $141_2$ and $141_3$. Similarly, resistor plate 127 has a constituent resistance 127 Rl between resistor VIAs $141_1$ and $141_2$ and a constituent resistance 127 Rr between resistor VIAs $141_2$ and $141_3$. Likewise, resistor plate 135 has a constituent resistance 135 Rl between resistor VIAs $141_1$ and $141_2$ and a constituent resistance 135 Rr between resistor VIAs $141_2$ and $141_3$.

A reference voltage Vref is applied to VIA $141_1$. The voltage of VIA $141_2$ drops proportionally to the reciprocal of [(1/131 Rl) plus (1/127 Rl) plus (1/135 Rl)]. Similarly, the voltage of VIA $141_3$ drops proportionally to the reciprocal of [1/(131 Rl plus 127 Rl plus 135 Rl) plus the reciprocal of [1/(131 Rr plus 127 Rr plus 135 Rr)].

Alternatively, a reference voltage Vref is applied to VIA $141_2$. The voltage of VIA $141_1$ drops proportionally to the reciprocal of [(1/131 Rl) plus (1/127 Rl) plus (1/135 Rl)]. The voltage of VIA $141_3$ drops proportionally to the reciprocal of [(1/131 Rr) plus (1/127 Rr) plus (1/135 Rr)].

Figure 11:
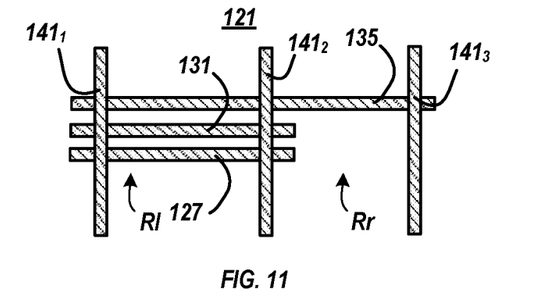

FIG. 11 depicts a detailed cross-section elevation view of resistor structure 103, according to an exemplary embodiment. In the depicted embodiment, resistor 121 includes resistor VIAs $141_1$, $141_2$, and $141_3$. Resistor VIAs $141_1$, $141_2$ are each connected to resistor plate 131, to resistor plate 127, and resistor plate 135. Resistor VIA $141_3$ is connected to just resistor plate 135.

Resistor plate 131 has a constituent resistance 131 Rl between resistor VIAs $141_1$ and $141_2$. Resistor plate 127 has a constituent resistance 127 Rl between resistor VIAs $141_1$ and $141_2$. Resistor plate 135 has a constituent resistance 135 Rl between resistor VIAs $141_1$ and $141_2$. Resistor plate 135 also has a constituent resistance 135 Rr between resistor VIAs $141_2$ and $141_3$.

A reference voltage Vref is applied to VIA $141_1$. The voltage of VIA $141_2$ drops proportionally to the reciprocal of [(1/131 Rl) plus (1/127 Rl) plus (1/135 Rl)]. Similarly, the voltage of VIA $141_3$ drops proportionally to the reciprocal of [(1/131 Rl) plus (1/127 Rl) plus (1/135 Rl)] plus 135 Rr.

Alternatively, a reference voltage Vref is applied to VIA $141_2$. The voltage of VIA $141_1$ drops proportionally to the reciprocal of [(1/131 Rl) plus (1/127 Rl) plus (1/135 Rl)]. The voltage of VIA $141_3$ drops proportionally to 131 Rr.

Figure 12:
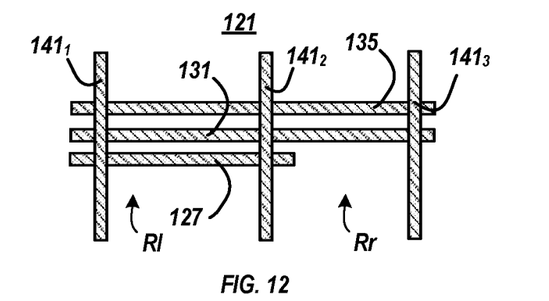

FIG. 12 depicts a detailed cross-section elevation view of resistor structure 103, according to an exemplary embodiment. In the depicted embodiment, resistor 121 includes resistor VIAs $141_1$, $141_2$, and $141_3$. Resistor VIAs $141_1$, $141_2$ are each connected to resistor plate 131, to resistor plate 127, and resistor plate 135. Resistor VIA $141_3$ is connected to resistor plate 135 and resistor plate 131.

Resistor plate 131 has a constituent resistance 131 Rl between resistor VIAs $141_1$ and $141_2$. Resistor plate 131 also has a constituent resistance 131 Rr between resistor VIAs $141_2$ and $141_3$. Resistor plate 127 has a constituent resistance 127 Rl between resistor VIAs $141_1$ and $141_2$. Resistor plate 135 has a constituent resistance 135 Rl between resistor VIAs $141_1$ and $141_2$. Resistor plate 135 also has a constituent resistance 135 Rr between resistor VIAs $141_2$ and $141_3$.

A reference voltage Vref is applied to VIA $141_1$. The voltage of VIA $141_2$ drops proportionally to the reciprocal of [(1/131 Rl) plus (1/127 Rl) plus (1/135 Rl)]. Similarly, the voltage of VIA $141_3$ drops proportionally to the reciprocal of [(1/131 Rl) plus (1/127 Rl) plus (1/135 Rl)] plus the reciprocal of [(1/135 Rr) plus (1/131 Rr)].

Alternatively, a reference voltage Vref is applied to VIA $141_2$. The voltage of VIA $141_1$ drops proportionally to the reciprocal of [(1/131 Rl) plus (1/127 Rl) plus (1/135 Rl)]. The voltage of VIA $141_3$ drops proportionally to the reciprocal of [(1/135 Rr) plus (1/131 Rr)].

As such, it may now be appreciated that a desired voltage drop from a reference voltage may be achieved by tuning variables associated with one or more resistor plates within resistor 121. For example, the number of resistor plates within the resistor 121 may be chosen to achieve, or otherwise assist in achieving, the desired voltage drop, the length of resistor plates between resistor VIAs may be chosen to achieve, or otherwise assist in achieving, the desired voltage drop, or the like, the front to rear dimension of one or more of the resistor plates may be chosen to achieve, or otherwise assist in achieving, the desired voltage drop, or the like.

Therefore, in a particular implementation, a high resistance may be required to achieve the desired voltage drop of one resistor VIA relative to a connected resistor VIA, and thus, a single resistor plate may be chosen to connect the resistor VIAs. In another implementation, a medium resistance may be required to achieve the desired voltage drop of one resistor VIA relative to a connected resistor VIA, and thus, two resistor plates may be chosen to connect the resistor VIAs. In yet another implementation, a low resistance may be required to achieve the desired voltage drop of one resistor VIA relative to a connected resistor VIA, and thus, three resistor plates may be chosen to connect the resistor VIAs.

Figure 13:
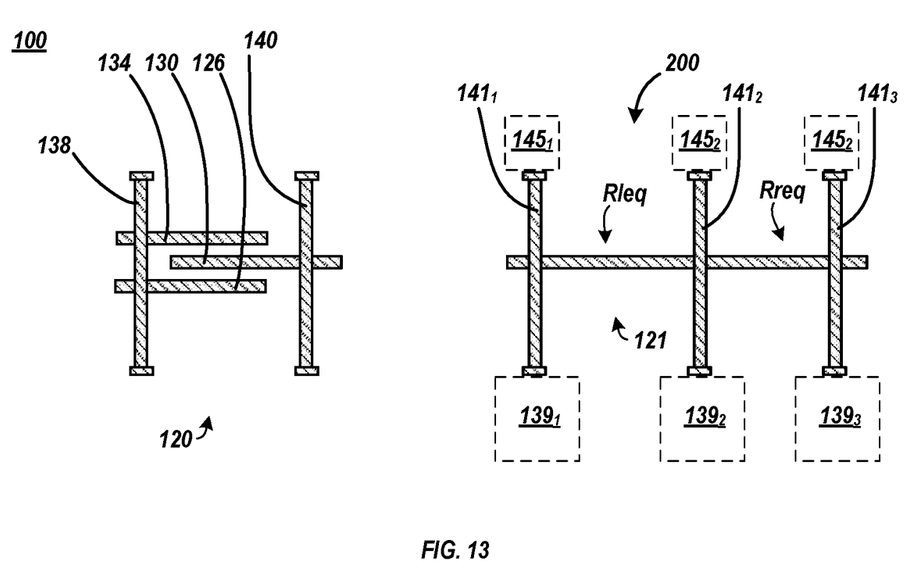
FIG. 13 is a cross-section elevation view of an on IC device capacitor and resistor structure, according to an exemplary embodiment.

FIG. 13 is a cross-section elevation view of an on IC device 100 capacitor and resistor structure, according to an exemplary embodiment. In the depicted embodiment, resistor 121 includes resistor VIAs $141_1$, $141_2$, and $141_3$. Resistor VIAs $141_1$, $141_2$, and $141_3$ are each connected to resistor plate 200. Resistor plate 200 may be any one or more resistor plates 127, 131, and/or 135.

Resistor plate 200 has a constituent resistance Rleq between resistor VIAs $141_1$ and $141_2$ and has a constituent resistance Rreq between resistor VIAs $141_2$ and $141_3$. Rleq and/or Rreq may be determined by combining component resistances of the plates 127, 131, 135, etc. utilizing known resistor in parallel and/or or known resistor in series rules.

Resistor VIA $141_1$ is connected to upper circuitry $145_1$ and to functional circuit(s) $139_1$. Functional circuit(s) $139_1$ are one or more circuits formed by the BE metallization layer 116 connecting components or active devices that are located at the active surface 112. Upper circuitry $145_1$ may be another BEOL interconnect stack, an external device interconnect pad, or the like.

Resistor VIA $141_2$ is connected to upper circuitry $145_2$ and to functional circuit(s) $139_2$. Functional circuit(s) $139_2$ are one or more circuits formed by the BE metallization layer 116 connecting components or active devices that are located at the active surface 112. Upper circuitry $145_2$ may be another BEOL interconnect stack, an external device interconnect pad, or the like.

Resistor VIA $141_3$ is connected to upper circuitry $145_3$ and to functional circuit(s) $139_3$. Functional circuit(s) $139_3$ are one or more circuits formed by the BE metallization layer 116 connecting components or active devices that are located at the active surface 112. Upper circuitry $145_3$ may be another BEOL interconnect stack, an external device interconnect pad, or the like.

A reference voltage Vref is applied to VIA $141_1$ and to functional circuit(s) $139_1$ by upper circuitry $145_1$ inducing current or signal flow therethrough. The voltage of VIA $141_2$ drops from Vref in proportion to Rleq and such dropped voltage is applied to functional circuit(s) $139_2$ inducing current or signal flow therethrough. Similarly, voltage of VIA $141_3$ drops from Vref in proportion to [Rleq plus Rreq] and such dropped voltage is applied to functional circuit(s) $139_3$ inducing current or signal flow therethrough.

Alternatively, a reference voltage Vref is applied to VIA $141_2$ and to functional circuit(s) $139_2$ by upper circuitry $145_2$ inducing current or signal flow therethrough. The voltage of VIA $141_1$ drops from Vref in proportion to Rleq and such dropped voltage is applied to functional circuit(s) $139_1$ inducing current or signal flow therethrough. Similarly, voltage of VIA $141_3$ drops from Vref in proportion to Rreq and such dropped voltage is applied to functional circuit(s) $139_3$ inducing current or signal flow therethrough.

Alternatively, a reference voltage Vref is applied to VIA $141_3$ and to functional circuit(s) $139_3$ by upper circuitry $145_3$ inducing current or signal flow therethrough. The voltage of VIA $141_2$ drops from Vref in proportion to Rreq and such dropped voltage is applied to functional circuit(s) $139_2$ inducing current or signal flow therethrough. Similarly, voltage of VIA $141_1$ drops from Vref in proportion to [Rleq plus Rreq] and such dropped voltage is applied to functional circuit(s) $139_1$ inducing current or signal flow therethrough.

Figure 14:
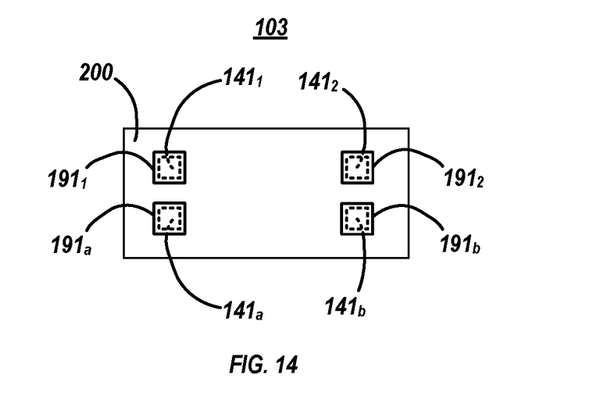
FIG. 14 and FIG. 15 are top plan cut-away views of a capacitor and resistor structure, according to an exemplary embodiment.
Figure 15:
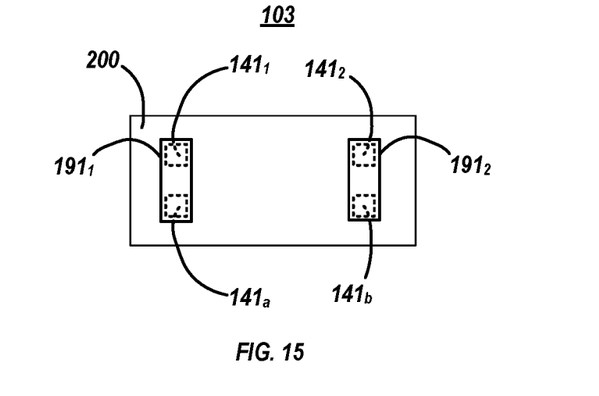

FIG. 14 and FIG. 15 are top plan cut-away views of a capacitor and resistor structure, according to an exemplary embodiment. FIG. 14 depicts an embodiment where one BE metallization 191 is associated with one resistor VIA 141. For Example, BE metallization $191_1$ is connected to resistor VIA $141_1$, BE metallization 1912 is connected to resistor VIA $141_2$, BE metallization $191_a$ is connected to resistor VIA $141_a$, and BE metallization $191_b$ is connected to resistor VIA $141_b$.

FIG. 15 depicts an embodiment where one BE metallization 191 is associated with multiple resistor VIAs 141. For Example, BE metallization $191_1$ is connected to resistor VIA $141_1$ and to resistor VIA $141_a$, BE metallization 1912 is connected to resistor VIA $141_2$ and to resistor VIA $141_b$. The various embodiments depicted in FIG. 14 and FIG. 15 may be chosen to achieve resistance precision and current carrying requirements.

FIG. 16 through FIG. 19 depict fabrication stage cross-section elevation views of an IC device capacitor and resistor structure, according to exemplary embodiments.

Figure 16:
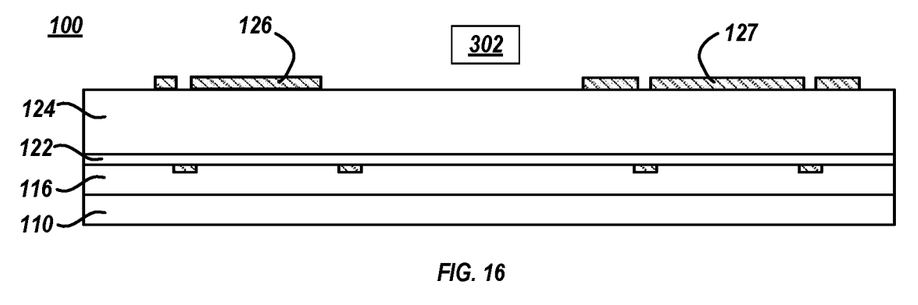
FIG. 16 through FIG. 19 depict fabrication stage cross-section elevation views of an IC device capacitor and resistor structure, according to exemplary embodiments.

FIG. 16 is a cross-section elevation of IC device 100 integrated capacitor and resistor structure during a fabrication stage 302, according to an example embodiment. At fabrication stage 302, VIA ILD layer 124 has received a metal layer that has been patterned to form the first capacitor plate(s) 126 and to form the resistor plate(s) 127 (if present). Conventional techniques may be used such as depositing conductive material upon VIA ILD layer 124, spinning on a mask, curing the mask to match the pattern of the first capacitor plate(s) 126 and of the first resistor plate(s) 127, and etching the conductive material layer, followed by removing the mask to reveal the first capacitor plate(s) 126 and the first resistor plate(s) 127, as depicted. Capacitor plate(s) 126 and resistor plate(s) 127 may include one or more VIA pilot holes, as depicted, in desired VIA locations.

Figure 17:
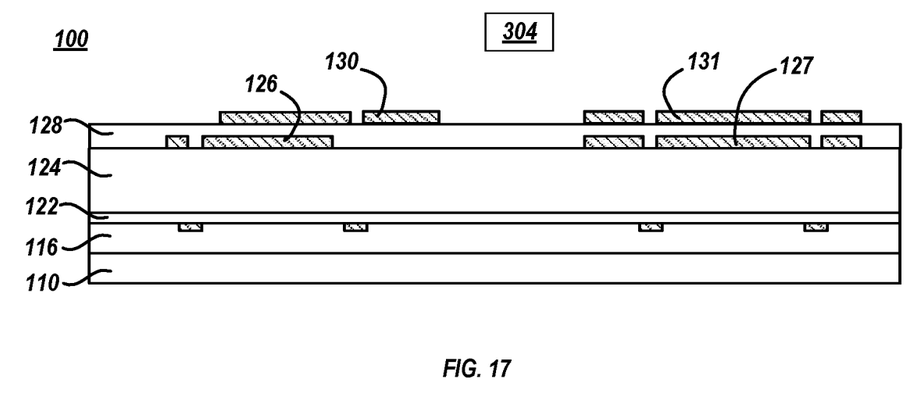

FIG. 17 is a cross-section elevation of IC device 100 integrated capacitor and resistor structure during a fabrication stage 304, according to an example embodiment. At fabrication stage 304, first dielectric layer 128 is formed upon the VIA ILD layer 124, formed over the first capacitor plate 126, and formed over the first resistor plate 127 (if present). First dielectric layer 128 may entirely cover first capacitor plate 126, entirely cover first resistor plate 127 (if present), as well fully cover exposed portions of the VIA ILD layer 124. Further at fabrication stage 304, capacitor plate(s) 130 are formed and resistor plate(s) 131 may be formed. Capacitor plates 130 and resistor plate(s) 131 may be formed by forming a second metal layer conformally over the first dielectric layer 128, such as chemical-vapor depositing the second metal layer. Conventional techniques may be used such as depositing conductive material, spinning on a mask, curing the mask to match the pattern of the second capacitor plate(s) 130 and of the second resistor plate(s) 131, and etching the conductive material, followed by removing the mask to reveal the second capacitor plate(s) 130 and the second resistor plate(s) 131, as depicted. Capacitor plate(s) 130 and resistor plate(s) 131 may include one or more VIA pilot holes, as depicted, in desired VIA locations.

Figure 18:
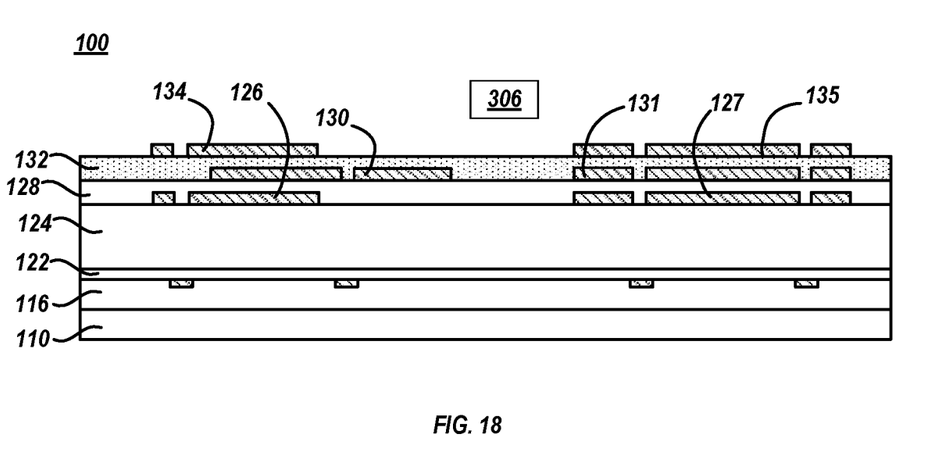

FIG. 18 is a cross-section elevation of IC device 100 integrated capacitor and resistor structure during a fabrication stage 306 according to an example embodiment. At fabrication stage 306, capacitor second dielectric layer 132 is formed upon first dielectric layer 128, formed over the second capacitor plate(s) 130, and formed over the second resistor plate(s) 131 (if present). Capacitor second dielectric layer 132 may entirely cover second capacitor plate(s) 130, may entirely cover the second resistor plate(s) 131, as well as fully cover exposed portions of the first dielectric layer 128. Further at fabrication stage 306, capacitor plate(s) 134 are formed and resistor plate(s) 135 may be formed. Capacitor plates 134 and resistor plate(s) 135 may be formed by forming a third metal layer conformally over the second dielectric layer 132, such as physical-vapor depositing the third metal layer. Conventional techniques may be used such as depositing conductive material, spinning on a mask, curing the mask to match the pattern of the third capacitor plate(s) 134 and the third resistor plate(s) 135, and etching the conductive material, followed by removing the mask to reveal the third capacitor plate(s) 134 and to reveal the resistor plate(s) 135, as depicted. Capacitor plate(s) 134 and resistor plate(s) 135 may include one or more VIA pilot holes, as depicted, in desired VIA locations.

Figure 19:
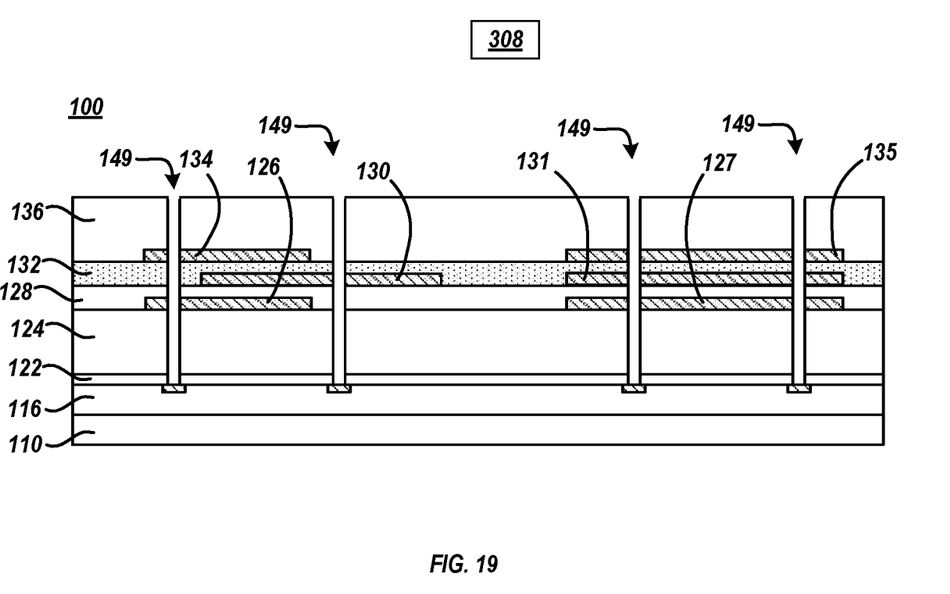

FIG. 19 is a cross-section elevation of IC device 100 integrated capacitor and resistor structure during a fabrication stage 308 according to an example embodiment. At fabrication stage 308, second VIA ILD layer 136 is formed upon second dielectric layer 132 and formed over the third capacitor plate(s) 134 and over the third resistor plate(s) 135 (if present). Capacitor VIA ILD layer 136 may entirely cover capacitor plate(s) 134, entirely cover the third resistor plate(s) 135, as well as fully cover exposed portions of the second dielectric layer 132. Further at stage 308, VIA recesses 149 are formed that penetrate the capacitor 120 and the resistor 121. The VIA recesses 149 each expose a respective upper metallization 118. The VIA recesses 149 may penetrate and extend through the various dielectric layers between the upper surface of layer 136 and the upper metallization 118 and may penetrate and extend through one or more resistor plates 127, 131, and/or 135 at the location of a VIA pilot hole therein. Further at stage 308, an adhesion layer may also be formed upon the sidewalls of the VIA recesses 149. Further processing results in embodiments that are illustrated and described for the IC device 100 integrated capacitor and resistor structure depicted in, e.g., FIG. 1, FIG. 3, FIG. 5. For example, VIA recess 149 may be filled with a conductive material, a second BE metallization 190, 191 may be formed upon VIAs 138, 140, 141, respectively, or the like.

Figure 20:
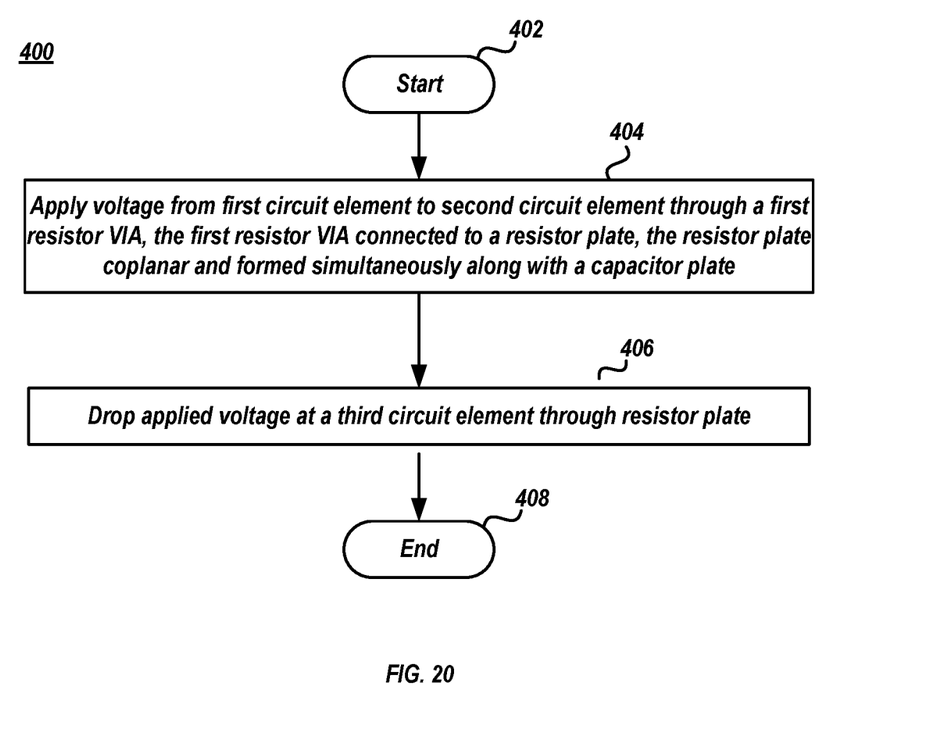
FIG. 20 depicts a method of dropping voltage across a resistor of a simultaneously formed capacitor and resistor structure, according to exemplary embodiments.

FIG. 20 depicts a method 400 of dropping voltage across a resistor of a simultaneously formed capacitor and resistor structure, according to exemplary embodiments. Method 400 begins at block 402 and continues with applying a voltage from a first circuit element to a second circuit element through a first resistor VIA (block 404). For example, a reference voltage Vref is applied to VIA $141_1$ and to functional circuit(s) $139_1$ by upper circuitry $145_1$ inducing current or signal flow therethrough. The current flow may be an electrical signal that is effectively passed from the first circuit element to the second circuit element. Therefore, the electrical signal may be transmitted from upper circuitry $145_1$ to functional circuit(s) $139_1$ by way of resistor VIA $141_1$, or vice versa. The first resistor VIA is connected to a resistor plate. For example, VIA $140_1$ is connected to resistor plate 127, 131, 135, etc. The resistor plate is formed simultaneously with a capacitor plate. For example, the resistor plate 127 may be positively formed (i.e., plate material added to the structure) during the same fabrication stage as capacitor plate 126. Alternatively, the resistor plate 127 may be negatively formed (i.e., material is removed while the plate material is retained therefrom) during the same fabrication stage as capacitor plate 126.

Method 400 may continue with dropping the applied voltage at a third circuit element through at least the resistor plate (block 406). For example, the reference voltage drops across resistor plate 127. The dropped voltage is applied to a second resistor VIA that is also connected to the resistor plate. For example, the dropped voltage is applied to VIA $141_2$. The reference voltage applied to the first resistor VIA effectively drops across the resistor plate at the second VIA and induces current or signal flow to a third circuit element and/or a fourth circuit element connected to the second resistor VIA. For example, the reference voltage applied to the first resistor VIA $141_1$ effectively drops across the resistor plate 127 at the second VIA $141_2$ and induces current or signal flow to upper circuitry $145_2$ and/or functional circuit(s) $139_2$. In embodiments, functional circuit(s) $139_1$ may be functional circuits designed to operate a first voltage and functional circuit(s) $139_2$ may be functional circuits designed to operate a second voltage that is less than the first voltage. In embodiments, particularly those in which when voltage applied from each upper circuitry 145 is relatively constant or the same (i.e. voltage applied to VIA $141_1$ while no voltage is applied to VIA $141_2$ and VIA $141_3$), the reduced or second voltage may be applied to the functional circuit(s) $139_2$ by applying the constant voltage to the first VIA $141_1$ and dropping the constant voltage across the resistor plate 200. Method 400 may end at block 408.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

Unless described otherwise or in addition to that described herein, "forming" or the like, may include any now known or later developed techniques appropriate for the material to be fabricated, including, but not limited to: CVD, LPCVD, PECVD, semi-atmosphere CVD (SACVD), high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the IC device. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A method comprising:
   simultaneously forming each capacitor plate amongst three capacitor plates of a metal-insulator-metal-insulator-metal (MIMIM) capacitor with a respective resistor plate amongst three resistor plates of a MIMIM resistor within an integrated circuit (IC) device;

forming a first resistor vertical interconnect access (VIA) upon a first back end of the line (BEOL) upper metallization trace that is below the three resistor plates, the first resistor VIA extending from the first upper BEOL metallization trace through and physically connected to the three resistor plates and further extending above the three resistor plates to and physically contacting a first external device contact pad;

forming a second resistor VIA upon a second BEOL upper metallization trace that is below the three resistor plates, the second resistor VIA extending from the second upper BEOL metallization trace through and physically connected to the three resistor plates and further extending above the three resistor plates to a second external device contact pad;

applying, at the first external device contact pad, a voltage to the first resistor VIA and to a first functional circuit connected to the first resistor VIA below the first BEOL upper metallization trace;

dropping the voltage across the three resistor plates; and applying the dropped voltage to the second resistor VIA and to a second functional circuit connected to the second resistor VIA below the second BEOL upper metallization trace.

2. The method of claim 1, further comprising:
forming a dielectric layer between each capacitor plate and between each resistor plate.

3. The method of claim 1, wherein each respective bottom and top surface of one of the three capacitor plates are coplanar with respective bottom and top surface of the one or the three resistor plates.

4. A method comprising:
simultaneously forming each capacitor plate amongst three capacitor plates of a metal-insulator-metal-insulator-metal (MIMIM) capacitor with a respective resistor plate amongst three resistor plates of a MIMIM resistor within an integrated circuit (IC) device;

forming a first resistor vertical interconnect access (VIA) upon a first back end of the line (BEOL) upper metallization trace that is below the three resistor plates, the first resistor VIA extending from the first upper BEOL metallization trace through and physically connected to the three resistor plates and further extending above the three resistor plates to and physically contacting a first external device contact pad;

forming a second resistor VIA upon a second BEOL upper metallization trace that is below the three resistor plates, the second resistor VIA extending from the second upper BEOL metallization trace through and physically connected to the three resistor plates and further extending above the three resistor plates to a second external device contact pad;

wherein the first resistor VIA receives an applied voltage from the first external device contact pad;

wherein the three resistor plates drops the applied voltage; and wherein the second resistor VIA receives the dropped applied voltage.

5. The method of claim 4, further comprising:
forming a dielectric layer between each capacitor plate and between each resistor plate.

6. The method of claim 4, wherein each respective bottom and top surface of one of the three capacitor plates are coplanar with respective bottom and top surface of the one or the three resistor plates.

* * * * *